US008936731B2

(12) United States Patent  
Madaro et al.

(10) Patent No.: US 8,936,731 B2
(45) Date of Patent: Jan. 20, 2015

(54) PROCESS FOR THE MANUFACTURE OF FERROELECTRIC MATERIALS

(75) Inventors: Francesco Madaro, Fort Worth, TX (US); Tor Grande, Trondheim (NO); MariAnn Einarsrud, Trondheim (NO); Kjell Wiik, Trondheim (NO)

(73) Assignee: Cerpotech AS, Trondheim (NO)

( * ) Notice: Subject to any disclaimer, the term of this patent is extended or adjusted under 35 U.S.C. 154(b) by 272 days.

(21) Appl. No.: 13/263,213

(22) PCT Filed: Mar. 4, 2010

(86) PCT No.: PCT/EP2010/001359
§ 371 (c)(1),
(2), (4) Date: Dec. 20, 2011

(87) PCT Pub. No.: WO2010/115493
PCT Pub. Date: Oct. 14, 2010

(65) Prior Publication Data
US 2012/0091389 A1    Apr. 19, 2012

(30) Foreign Application Priority Data
Apr. 6, 2009 (GB) .................................. 0905998.1

(51) Int. Cl.
*C01G 33/00* (2006.01)
*C01G 35/00* (2006.01)
(Continued)

(52) U.S. Cl.
CPC ....... *C01G 33/006* (2013.01); *C04B 2235/3201* (2013.01); *C01P 2002/88* (2013.01);
(Continued)

(58) Field of Classification Search
USPC ............ 252/62.9 R; 501/134, 135; 423/594.8
See application file for complete search history.

(56) References Cited

U.S. PATENT DOCUMENTS 5,051,280 A * 9/1991 Hung ........................... 427/226
6,620,750 B2   9/2003 Kim et al.
(Continued)

FOREIGN PATENT DOCUMENTS

EP    0460726 A1    12/1991
EP    0479162 A1    4/1992
(Continued)

OTHER PUBLICATIONS

International Search Report and Written Opinion mailed Feb. 10, 2011 (PCT/EP2010/001359): ISA/EP.
(Continued)

*Primary Examiner* — Carol M Koslow
(74) *Attorney, Agent, or Firm* — Banner & Witcoff Ltd.

(57) ABSTRACT

A process for the preparation of a niobium compound of formula (I):

$$D_\alpha Nb_\beta E_\gamma O_{3-\delta} \quad (I)$$

wherein
D is an alkali metal (e.g. Li, Na, K, Rb, Cs and/or Fr), alkaline earth metal (such as Ba, Ca, Mg and/or Sr), La and/or Bi and may be present as a mixture of two or more metals;
E is Ta, Sb and/or Fe and may be present as a mixture of two or more metals;
$\alpha$ is a positive number
$\beta$ is a positive number
$\gamma$ is zero or a positive number
$\delta$ is a number $0 \leq \delta \leq 0.5$;
and wherein the formula (I) has the perovskite or tungsten bronze structure;
comprising spray pyrolising a solution, for example an aqueous solution, comprising metal (D) ions, Nb ions and if present, metal (E) ions.

24 Claims, 10 Drawing Sheets

(51) Int. Cl.
*C04B 35/495* (2006.01)
*C04B 35/64* (2006.01)
*C04B 35/626* (2006.01)
*H01L 41/107* (2006.01)
*H01L 41/187* (2006.01)

(52) U.S. Cl.
CPC ......... *C01P2002/30* (2013.01); *C01P 2002/34* (2013.01); *C01G 35/00* (2013.01); *C01P 2004/10* (2013.01); *C04B 35/495* (2013.01); *C01P 2004/03* (2013.01); *C01P 2004/62* (2013.01); *C04B 2235/81* (2013.01); *C04B 2235/3205* (2013.01); *C04B 2235/3298* (2013.01); *C01G 33/00* (2013.01); *C04B 35/62645* (2013.01); *C01P 2004/54* (2013.01); *C04B 2235/3272* (2013.01); *C04B 2235/3227* (2013.01); *C04B 2235/3251* (2013.01); *C01P 2002/72* (2013.01); *C04B 35/6267* (2013.01); *H01L 41/1873* (2013.01)
USPC .................. 252/62.9 R; 423/594.8; 501/134; 501/135

(56) References Cited

U.S. PATENT DOCUMENTS

| | | | |
|---|---|---|---|
| 6,849,334 B2 * | 2/2005 | Horne et al. | 428/402 |
| 7,211,236 B2 * | 5/2007 | Stark et al. | 423/592.1 |
| 2005/0098204 A1 | 5/2005 | Roscheisen et al. | |
| 2007/0097481 A1 | 5/2007 | Burdis et al. | |
| 2008/0135798 A1 | 6/2008 | Jeon et al. | |

FOREIGN PATENT DOCUMENTS

| | | |
|---|---|---|
| EP | 1308418 A1 | 5/2003 |
| EP | 1457471 A2 | 9/2004 |
| JP | 61-083628 | 4/1986 |
| JP | 63-210001 | 8/1988 |
| WO | 2006066918 A2 | 6/2006 |
| WO | 2008122458 A1 | 10/2008 |

OTHER PUBLICATIONS

Zhou, Xiao-Dong et al: "Spray Pyrolysis Synthesis and Dielectric Properties of Pb(Mg1/3Nb1/3)03" Journal of the American Ceramic Society, vol. 91, No. 8, Jul. 10, 2008, pp. 2766-2768, XP002587838 ISSN: 0002-7820 DOI: 10.1111/j.1551-2916.2008.02519.x.

Malic, Barbara et al: "Alkaline-earthdoping in (K,Na)Nb03 based piezoceramics" Journal of the European Ceramic Society, vol. 25, No. 12, Apr. 5, 2005, pp. 2707-2711, XP002587839 DOI: 10.1016/j.jeurceramsoc.2005.03.127 p. 2707 "Introduction", p. 2707-p. 2708 "Experimental".

Jing-Feng Li et al: "Ferroelectric and Piezoelectric Properties of Fine-Grained Na0.5K0.5Nb03 Lead-Free Piezoelectric Ceramics Prepared by Spark Plasma Sintering" Journal of the American Ceramic Society, vol. 89, No. 2, Nov. 23, 2005, pp. 706-709, XP002587840 DOI: 10.1111/j.1551-2916.2005.00743.x.

Sun et al in Sci. Technol. Adv. Mater., vol. 9, 2008, pp. 1-4, "BiFeO3-doped (Na0.5K0.5)NbO3 lead-free piezoelectric ceramics".

Kang Hyun Woo et al "Preparation of NaTaO3 by Spray Pyrolysis and Evaluation of Apparent Photocatalytic Activity for Hydrogen Production from Water", Hindawi Publishing Corporation International Journal of Photoenergy vol. 2008, Article ID 519643, 8 pages doi:l0.1155/2008/519643.

V Bornand, I Huet, Ph Papet (2002) LiNb03 thin films deposited on substrates: a morphological development study. Materials Chemistry and Physics 91(8), 571-577.

Search Report dated Apr. 12, 2010 (GB0905998.1); SA/GB.

Song Shin AE et al "Preparation of Y203 Particles by Flame Spray Pyrolysis with Emulsion", Langmuir 2009, 25, 3402-3406.

* cited by examiner

PROCESS FOR THE MANUFACTURE OF FERROELECTRIC MATERIALS

CROSS-REFERENCE TO RELATED APPLICATIONS

The present application is a U.S. National Phase filing of International Application No. PCT/EP2010/001359 filed on Mar. 4, 2010, designating the United States of America and claiming priority to Great Britain Patent Application No. 0905998.1 filed on Apr. 6, 2009. The present application claims priority to and the benefit of all the above-identified applications, and all the above-identified applications are incorporated by reference herein in their entireties.

FIELD

The present invention relates to a new process for the manufacture of ferroelectric materials in the form of alkali metal niobates or mixed niobium-tantalum oxide solid solutions. The nanoscale niobates and mixed niobium-tantalum oxide products of the process are also encompassed by the invention, as is their use in the manufacture of electronic devices, in particular transducers, ultrasound diagnostic equipment, gas ignitors, accelerometers, displacement transducers and piezoelectric transformers, actuators, sensors and the devices thus obtained.

BACKGROUND

Ferroelectric materials have many important applications as functional materials in electronics and optics. A large number of ferroelectric ceramics exploit properties that are an indirect consequence of ferroelectricity, such as dielectric, piezoelectric, pyroelectric and electro-optic properties. With the development of ceramic processing and thin film technology, many new applications have emerged. The biggest uses of ferroelectric ceramics have been in areas such as dielectric ceramics for capacitor applications, ferroelectric thin films for non volatile memories, piezoelectric materials for medical ultrasound imaging and actuators, and electro-optic materials for data storage and displays.

The most commonly used piezoelectric material, lead zirconate titanate (PZT), has the chemical formula $PbZr_xTi_{1-x}O_3$, and is a binary solid solution of $PbZrO_3$ (orthorhombic) and $PbTiO_3$ (tetragonal perovskite). PZT has a perovskite type structure with the $Ti^{4+}$ and $Zr^{4+}$ ions occupying the B site at random.

Other lead-based ferroelectric compounds include lead niobate, $PbNb_2O_6$, which has a tungsten bronze type structure. The tungsten bronze family has a more open structure compared with the perovskites and a wide range of cation and anion substitutions are possible without loss of ferroelectricity. However, it is difficult to fabricate piezoelectric $PbNb_2O_6$-type ceramics because of the formation of a stable non-ferroelectric rhombohedral phase on cooling to room temperature. This problem has been addressed by rapid cooling from the sintering temperature, however, there is a further problem associated with this type of material, the large volume change due to phase transformation on cooling below the Curie point, leading to cracking of the ceramic.

Lead bismuth niobate ($PbBi_2Nb_2O_9$) has a bismuth oxide layered type structure consisting of corner-linked perovskite-like sheets separated by $(Bi_2O_2)^{2+}$ layers. The plate like crystal structure of these compounds leads to highly anisotropic ferroelectric properties. However, the piezoelectric properties are not good because of a very low poling efficiency.

Poling is a process used to induce piezoelectric behaviour in a ferroelectric ceramic by applying a direct current electric field at a high temperature that is below the Curie point of the material. On application of the external field the spontaneous polarisation within each domain of the ceramic is orientated in the direction of the applied field, leading to a net polarisation in the poling direction, but the domains in a ceramic cannot fully align along the poling axis because the orientation of the polarisation is restricted by the symmetry of the crystal structure. For example, an orthorhombic perovskite has polarisation oriented along one of the eight [111] directions. The higher the number of possible orientations, the better the poling efficiency. Hence, compounds with a higher symmetry would be expected to have better poling efficiency and better piezoelectric properties, for example, a tetragonal or orthorhombic structure would be expected to have better poling efficiency than a monoclinic structure.

It has been possible to improve the piezoelectric properties of bismuth oxide layered type structures by grain orientation during the processing step, for example by tape casting or hot forging of the ceramic. The bismuth oxide layered structured ferroelectrics may become important piezoelectric ceramics because of their higher stability, higher operating temperature (Curie temperatures in the range of 550-650° C.) and higher operating frequency. These ceramics are mainly useful for piezoelectric resonators which need to exhibit a very stable resonant frequency.

In J Am Ceram Soc 91, [8], 2766-2768, $Pb(Mg_{1/3}Nb_{2/3})O_3$ is disclosed as a candidate for capacitor dielectrics and electroconstrictive actuators. The compound is made by spray pyrolysis.

There has been increased interest recently in lead-free piezoelectric/ferroelectric materials because the most commonly used piezoelectric ceramics are lead-based and are being phased out for environmental reasons relating to the toxicity of electronic waste.

The present inventors have realised that the most attractive materials to replace PZT are the alkali metal niobates. $K_{0.5}Na_{0.5}NbO_3$ (KNN), $Li_xNa_{1-x}NbO_3$ wherein x<0.2 and KNN—$LiNbO_3$, composite materials and doped derivatives thereof, have been described, for example by Sun et al. in Sci. Technol. Adv. Mater., Vol. 9, 2008, pp. 1-4, "$BiFeO_3$-doped $(Na_{0.5}K_{0.5})NbO_3$ lead-free piezoelectric ceramics". Also, in US2008/01355798 lead free piezoceramic $K_{0.5}Na_{0.5}NbO_3$ compounds are described but these compounds are formed by solid state chemistry. In Materials Chemistry and Physics 77(2002) 571-577, thin films of $LiNbO_3$ are deposited on silicon substrates by sputtering or spray pyrolysis.

Ferroelectric crystals grown from solid solutions of alkali and alkaline earth niobates have shown potential for use in laser modulation, pyroelectric detectors, hydrophones and ultrasonic applications. However, the traditional synthesis route for ceramic powders by firing oxides of the different cations gives a coarse powder which needs a very high sintering temperature. This is a particular problem here due to the volatilization of the alkali metals above about 1000° C., and poor sinterability has been the main obstacle for the development of these materials. The main challenge is the provision of single phase, fine-grained and dense ceramics, preferably with a high degree of preferential orientation in order to obtain improved ferroelectric properties. A high quality ceramic powder is defined by having a small particle size, narrow particle size distribution, low degree of agglomeration, high purity and high phase purity; hence sub-micron powders of these components are attractive possibilities in the development of lead-free piezoelectric and ferroelectric materials.

As noted in US2008/01355798, the use of solid state reaction method results in particle sizes greater than hundreds of nanometers. In order to manufacture particles of an acceptable size, the inventors in US2008/01355798 mill the particles. When a powder is made by a solid state reaction method a high temperature is necessary for the different oxides to react with each other. At this high temperature, coarsening of the particles occurs and they become large. The particles therefore must be milled to reduce the size of the particles, also known as primary particles or crystallites, into smaller particles. To break down these primary particles requires a lot of energy and breaking them down to sub micron level, for example less than 500 nm, is problematic. The present inventors have found a process which makes the necessary small particles or crystallites directly.

The synthesis route of the present invention starts with a stable solution of cations to build up the material. To achieve a small particle size from the aqueous solution, spray pyrolysis is used to directly prepare the oxide powder. By using spray pyrolysis, a large scale preparation of high quality powder is possible. The process of the present invention can be applied to form alkali metal niobates or mixed niobium-tantalum oxide solid solutions. It is also possible to dope the compositions with small amounts of other elements by adding salts, e.g. nitrate(s), of the dopant(s) to the solution.

SUMMARY OF THE INVENTION

Viewed from one aspect the present invention provides a process for the preparation of a niobium compound of formula (I):

$$D_\alpha Nb_\beta E_\gamma O_{3-\delta} \quad (I)$$

(wherein
D is an alkali metal (e.g. Li, Na, K, Rb, Cs and/or Fr), alkaline earth metal (such as Ba, Ca, Mg and/or Sr), La and/or Bi;
E is Ta, Sb and/or Fe;
$\alpha$ is a positive number
$\beta$ is a positive number
$\gamma$ is zero or a positive number
$\delta$ is a number $0 \leq \delta \leq 0.5$;
and wherein the formula (I) has the perovskite or tungsten bronze structure;
comprising spray pyrolising a solution, for example an aqueous solution, comprising metal (D) ions, Nb ions and if present, metal (E) ions.

Viewed from another aspect the present invention provides a process for the preparation of an alkali metal niobium oxide of formula (Ia):

$$A_{1-2x-3w}B_xC_wNb_{1-y-3/5z-u}Ta_yFe_zSb_uO_3 \quad (Ia)$$

(wherein
A is an alkali metal, e.g. Li, Na, K, Rb, Cs and/or Fr;
B is an alkaline earth metal such as Ba, Ca, Mg and/or Sr, C is La, and/or Bi;
$0 \leq z \leq 0.3$; $0 \leq u \leq 0.3$; $0 \leq w \leq 0.3$; $0 \leq x \leq 0.3$, $0 \leq y < 1$ and $0 \leq z \leq 0.3$, the values of u, w, x, y and z being independent of each other with the proviso that the sum of y+3/5z+u is less than 1 and with the proviso that the sum of 3w+2x is less than 1;
A may be present as a mixture of two or more alkali metals; and
B may be present as a mixture of two or more alkaline earth metals;)
comprising spray pyrolising a solution, for example an aqueous solution, comprising alkali metal (A) ions, Nb ions and optionally alkaline earth ions (B) and/or Ta and/or Fe ions and/or Sb ions.

Viewed from another aspect the present invention provides a process for the preparation of an alkali metal niobium oxide of formula (Ib):

$$A_{1-2x-3w}B_xC_wNb_{1-y-3/5z}Ta_yFe_zO_3 \quad (Ib)$$

(wherein
A is an alkali metal, e.g. Li, Na, K, Rb, Cs and/or Fr;
B is an alkaline earth metal such as Ba, Ca, Mg and/or Sr, C is La, and/or Bi;
$0 \leq w \leq 0.3$; $0 \leq x \leq 0.3$, $0 \leq y < 1$ and $0 \leq z \leq 0.3$, the values of w, x, y and z being independent of each other with the proviso that the sum of y+3/5z is less than 1 and with the proviso that the sum of 3w+2x is less than 1;
A may be present as a mixture of two or more alkali metals; and
B may be present as a mixture of two or more alkaline earth metals;)
comprising spray pyrolising a solution, for example an aqueous solution, comprising alkali metal (A) ions, Nb ions and optionally alkaline earth ions (B) and/or Ta and/or Fe ions.

Viewed from a still further aspect the present invention provides a process for the preparation of an alkali metal niobium oxide of formula (Ic):

$$A_{1-2x}B_xNb_{1-y}Ta_yO_3 \quad (Ic)$$

(wherein
A is an alkali metal, e.g. Li, Na, K, Rb, Cs and/or Fr;
B is an alkaline earth metal such as Ba, Ca, Mg and/or Sr;
$0 \leq x \leq 0.3$ and $0 \leq y < 1$, the values of x and y being independent of each other;
A may be present as a mixture of two or more alkali metals; and
B may be present as a mixture of two or more alkaline earth metals;)
comprising spray pyrolising a solution, for example an aqueous solution, comprising alkali metal (A) ions, Nb ions and optionally alkaline earth ions (B) and/or Ta ions.

Viewed from another aspect the invention provides a niobium compound, e.g. an alkali metal niobium oxide produced by the process as hereinbefore defined.

General formula (I) covers both stoichiometric and non stoichiometric compounds. It is preferred if the combined valency of D, Nb and E is between 5+ and 6+, inclusive. The cations and anions need to be present in such ratios that a stable perovskite or tungsten bronze structure is formed, preferably a perovskite structure.

It is preferred if the value of $\alpha$ is a positive number of at least 0.5, more preferably at least 0.8, e.g. at least 0.9. The maximum value of $\alpha$ is preferably 1.

It is preferred if $\beta$ is a positive number of at least 0.8, more preferably at least 0.9. Ideally $\beta$ is 1 and preferably the value of $\beta$ should not exceed 1.

It is preferred if $\gamma$ is zero or a positive number up to 0.3.

Preferably $\delta$ is a number $0 \leq \delta \leq 0.3$, especially $\delta$ is a number $0 \leq \delta \leq 0.1$. Either or both of the oxygen O-site and cation D-site can be non-stoichiometric, so that the values of $\delta$ and $\alpha$ are independent of one another. It is preferred if the value of a corresponds to the stoichiometric value (e.g. 1 or 2) or is a number up to 0.1 less than the stoichiometric value. Especially preferably the non-stoichiometry is confined to the oxygen site, i.e. $\alpha$ corresponds to a stoichiometric value.

E may be present as a mixture of two or more metals or may represent one metal. Preferably, E is Ta or absent. D may be present as a mixture of two or more metals or may represent one metal, The definition of D preferably matches the definition of A, i.e. is an alkali metal. D may therefore be present as a mixture of two alkali metal ions.

It is preferred if the compounds of the invention are essentially stoichiometric. The invention will therefore be further defined with reference to stoichiometric compounds although it will be appreciated that the preferred embodiments described below in connection with formulae (Ia-c) could be applied more generally to formula (I). Embodiments described with reference to formula (I) apply equally to formula (Ia-c). It will also be appreciated that whilst many preferred embodiments are further described with reference to formula (Ia) many of these preferred features also apply to formulae (Ib-c) as well.

It is a preferred aspect of the invention that the compound of formula (Ia) formed by the process of the invention is not doped, i.e. the value of x=0 and the value of w is 0. If a doping ion B or C is present, it is preferred that only one doping ion is present, i.e. if a B ion is present then w is 0 or if a C ion is present then x is 0.

It is preferred if the total of 3w+2x is less than 0.5, preferably less than 0.3, especially less than 0.1.

It is another aspect of the invention that the compound of formula (Ia) can be doped such that the value of x is between 0 and a maximum of 0.1. Ideally, the value of x (if not 0) should be in the range 0.001 to 0.1, preferably 0.002 to 0.08, especially 0.005 to 0.05. Preferred doping metal ions (B) are Mg, Ca or Sr, especially Ca or Sr. These doping alkaline earth metal ions are obviously in the 2+ oxidation state.

It is another aspect of the invention that the compound of formula (Ia) can be doped such that the value of w is between 0 and a maximum of 0.1. Ideally, the value of w (if not 0) should be in the range 0.001 to 0.1, preferably 0.002 to 0.08, especially 0.005 to 0.05. The C doping ions are obviously in the 3+ oxidation state.

In one aspect of the invention metal ion A can be any alkali metal or a mixture of two or more alkali metals. Preferably the alkali metal is Na or K, or a mixture of Na and K, and most preferably a mixture of Na/K. Where two alkali metals are present the preferred molar ratio of each metal is in the range 0.4:0.6 to 0.6:0.4, more preferably 0.45:0.55 to 0.55:0.45, most preferably 1:1. Highly preferably these ratios apply to Na/K mixed niobates. A highly preferred compound of formula (I) is therefore $Na_{0.5}K_{0.5}Nb_{1-y}Ta_yO_3$.

The value of y can vary in the range of 0 to less than 1, preferably in the range 0-0.5. Where the oxide comprises Ta, even more preferred Ta content, i.e. y values are 0.05-0.3, most preferably 0.075-0.15.

The compound of the invention may optionally be doped with Fe instead of or in addition to Ta. It is preferred however if Fe is absent. If present, it is preferred that the Fe content, i.e. z is in the range 0-0.1, preferably 0-0.07. It will be appreciated that Fe is in the 3+ oxidation state in this invention.

The compound of the invention may optionally be doped with Sb instead of or in addition to Ta/Fe. It is preferred however if Sb is absent. If present, it is preferred that the Sb content, i.e. u is in the range 0-0.1, preferably 0.01-0.07.

It is preferred if the sum of y+3/5z+u is less than 0.5, more preferably less than 0.3, especially less than 0.1. Preferred compounds are free of Fe and Sb. Highly preferred compounds are free of any Ta or Fe, i.e. y is 0 and z is 0.

Still further preferred compounds of the invention are therefore of formula (II)

$$A_{1-2x}B_xNbO_3 \qquad (II)$$

where A, x and B are as hereinbefore defined.

Still further preferred compounds of the invention are of formula (III)

$$ANbO_3 \qquad (III)$$

where A is as hereinbefore defined.

Still further preferred compounds of the invention are of formula (IV)

$$Na_{1-x}K_xNbO_3 \qquad (IV)$$

where x is between 0 and 1, e.g. 0.5.

It will be appreciated that any Nb or Ta ion in the compounds formed by the process of the invention is in the 5+ oxidation state.

It is preferred if the compound of formula (I) or (Ia-c) has the perovskite structure.

It is especially preferred if the niobium oxide of the invention which is formed in the spray pyrolysis process has a very small particle size (also called crystallite size herein), e.g. a particle or crystallite size of less than 600 nm, e.g. less than 500 nm. In some especially preferred embodiment the particle or crystallite size is less than 250 nm, especially less than 100 nm, e.g. less than 60 nm. The particle sizes quoted herein represent average particle size. Particle sizes may be measured by surface area or by electron microscopy studies.

It is a preferred feature of this invention that the primary particles or crystallites formed by the spray pyrolysis process are already of a size which can be used without any milling procedure. It may however by necessary to break up agglomerates of particles which can form during spray pyrolysis. This breaking up process is a low energy process and can be considered different to conventional higher energy milling. Whilst break up of the particles is typically achieved using a milling machine, the energy required to break up an agglomerate of primary particles is very much lower than the energy required to mill a large particle.

The process of the invention involves the spray pyrolysis of a solution containing all the metal ions required to form the desired compound of formula (I). The invention relies therefore on the formation of a solution of the metal ions necessary to form the niobium oxide of formula (I). It is therefore necessary to provide soluble metal salts of each reactant metal ion.

For any metal ion, any convenient metal salt can be used if it is soluble. Preferred metal salts are nitrates, oxalates and/or dioxalates, and salts of organic acids, especially acetates. Particularly preferred are nitrates, oxalates and/or dioxalates.

The solution required can be prepared by dissolving salts in the solvent simultaneously or sequentially or could involve the preparation of one or more precursor solutions containing one or more of the reactant metal ions. The skilled man can devise ways of making the solution required. Preferably the invention utilises a precursor solution of Nb ions to which the A ions are added via their solid salts (e.g. as the sodium nitrate). The readily soluble salt then dissolves.

Soluble alkali metal (A) salts can be prepared using any convenient counter ion (e.g. a nitrate, chloride, sulphate and so on) or using a complexing agent with appropriate solvent. Suitable complexing agents could be hexadentate, pentadentate, tetradentate, tridentate or bidentate ligands, in particular amino polycarboxylic acid chelating agents. Suitable ligands include EDTA, cyclohexanediamine tetraacetic acid (CDTA), DOTA, DTPA and ethylene diamine. EDTA is preferred.

Preferably the solution of the invention uses the solvent water. The skilled man will appreciate that alkali metal salts are generally readily soluble so all manner of salts can be used here although it is essential that the counter ion/complexing agent used with the metal ion A, B, Nb, Fe, Sb and/or Ta material do not form insoluble salts with any other metal ion present.

Soluble niobium salts are less common due to the acidity of Nb but any convenient soluble salt may be used. Normally a precursor solution of Nb ions is formed. The Nb precursor solution which needs to be mixed with the alkali metal ions preferably uses water as solvent. Any water used as a solvent in the process of the invention will preferably be at a pH of at least 4, i.e. no acidifying agent is present, e.g. no nitric acid. Preferably water alone, especially distilled water is employed. The avoidance of acidic conditions during the processing and spraying steps of the invention is advantageous as acids are necessarily damaging to equipment and so on.

A convenient commercially available starting material for the formation of an Nb solution is $NH_4NbO(C_2O_4)_2$. If Ta ions are present, these ions will conveniently be introduced at the same time at the Nb. Tantalum oxalate solution is also commercially available.

Alternative, non oxalate Nb solutions can be formed from $NH_4NbO(C_2O_4)_2$. Basifiying a solution of $NH_4NbO(C_2O_4)_2$ e.g. to around pH 11 (e.g. using ammonium hydroxide) causes a form of niobic acid to precipitate. The basified solution of $NH_4NbO(C_2O_4)_2$ can be aged at high temperature (e.g. 50 to 100° C.) for a few hours (e.g. 6 hours) and subsequently left at ambient temperature for about twice the high temperature time (e.g. 12 hours) before the material is centrifuged in the presence of a base such as ammonia solution. The aging process is believed to cause the formation of the acid precipitate and agglomeration of the particles. Centrifugation in the presence of a base is a washing step carried out to remove oxalate ions. This washing step may be repeated a number of times to ensure that all oxalate is removed.

The solid material isolated from the centrifuge is free of oxalate as this is removed by the added base and may be redissolved in a multicarboxylated acid such as tartaric acid, citric acid or malic acid. Malic acid is preferred here. After stirring at high temperature, (e.g. 50 to 100° C.) a solution of Nb ions is formed. Thus, the Nb ions may be held in solution in the form of a malic acid complex or other multicarboxylated acid complex.

The molarity of the Nb solution used in the process of the invention is preferably in the range of 0.01 to 0.5M, e.g. 0.05 to 0.25M, especially 0.1 to 0.2M. Stirring, sonication or other mixing techniques can be used to ensure homogeneity here. Preferably mixing of the Nb salt and water takes place over a period of at least 6 hours. It is also preferred if during this stirring process the temperature is elevated slightly, e.g. up to 100° C.

The ions of A (or D or E etc) and Nb and optionally Ta, Fe, Sb and B and C ions can then be mixed in an appropriate ratio (e.g. depending on the molarity of each solution used and the desired stoichiometry of the final product) and the solution which forms can be spray pyrolysed. Stirring, sonication or other mixing techniques can again be used to ensure homogeneity of the solution prior to spray pyrolysis. Preferably mixing takes place over a period of at least 6 hours.

It is highly preferred if the solvent used throughout the manufacturing process is water.

The pressure in the spray pyrolysis process may be in the range 1 to 2 bars. This can be achieved using a nozzle 0.5 to 5 mm, e.g. 2 mm in diameter. The atomising gas can be any gas which is inert to the reactant materials, preferably air.

Atomisation may occur into a rotating furnace at temperatures of from 500 to 1000° C., preferably 750 to 950° C., more preferably 800 to 900° C., especially 810 to 870° C. such as 840 to 850° C. Temperature should ideally be above 800° C.

The powder which exits the furnace (e.g. at a temperature of approximately 400 to 550° C.) can be collected in a cyclone. It is preferred if crystallite size at this point is less than 200 nm, especially less than 100 nm.

The harvesting of the spray pyrolysed material should not involve a scraping step, where formed particles are scraped off a deposition surface. If particles are scraped from such a surface there is the possibility of contamination of the particles with material from the scraped surface. Scraping also adds a further step to the process which is unnecessary if spray pyrolysis is carried out properly.

The particles of this invention can also be formed without any deposition surface. We do not need to spray pyrolyse onto a surface to induce particle formation rather, our particles form due to volatisation of the solvents from the atomized droplets, preferably formed by the two-phase nozzle described below. Deposition is in fact a potential problem as it can lead to scraping of the formed particles from the deposition surface and hence contamination. Deposition onto a surface also leads to the formation of a layer of material on that surface, i.e. to the formation of a film. The present invention primarily concerns the formation of distinguishable particles and not a thin film on a substrate. We prefer to collect particles in a cyclone thus creating a free flowing powder and not a film.

It is therefore preferred if the spray pyrolysed particles of this invention form a free flowing powder. The particles should not therefore aggregate into an amorphous composition or be formed as a film layer on a substrate. The formation of a free flowing powder directly after spray pyrolysis is a further preferred feature of the invention. It is thus a feature of the invention that the particles formed directly after spray pyrolysis preferably do not adhere to any surface.

By forming free flowing particles, the particle size distribution of the particles is better. In particular, it is preferred if the particles of the invention have a (Malvern) particle size distribution which conforms to $D(v, 0.5)$ of 1 to 40 µm and a value of the ratio of $D(v, 0.9)$-$D(v, 0.1)$ to $D(v, 0.5)$ of no more than 1. Preferably, the $D(v, 0.5)$ value is 1 to 20 µm. These values are achieved directly after spray pyrolysis and before subsequent processing steps.

The particles formed after spray pyrolysis have the perovskite or tungsten bronze crystal structure.

Controlling particle size is an important aspect of the invention. In order to achieve the best control, the spray pyrolysis method of the invention preferably employs a spray pyrolysis technique or a flame pyrolysis technique. These techniques may employ a two phase nozzle arrangement to ensure atomisation, good particle size distribution and good yields. Ultrasonic atomisation is often used in spray pyrolysis but suffers from limitations in terms of scale up and in terms of particle size control. Whilst ultrasonic atomisation might be acceptable in the laboratory, it is not practical for use in producing more than a few grams of material. The present invention therefore preferably employs a two phase nozzle arrangement during spray pyrolysis.

In this arrangement, the particle precursor materials are provided in the form of an emulsion or solution which is atomised in a two phase nozzle and flows into a hot zone such as a flame or furnace. In the hot zone each droplet is converted to a particle and any solvent/emulsion components etc are decomposed into gas. Particle size can be controlled by varying droplet size. Droplet size is in turn controlled by manipulation of the nozzle outlet. Langmuir 2009, 25, 3402-3406 contains a description of the use of flame spray pyrolysis in the manufacture of yttrium oxide particles and provides the skilled man with details of this known process.

In particular, in the pyrolysis process, mixing means, for producing a flow mixture of solution, e.g. aqueous solution, and air, is combined with an atomizing nozzle to provide a nozzle assembly which produces a jet of very fine droplets. The nozzle assembly is used in conjunction with a hot zone such as a furnace. The mixing means comprises a pipe, external of the hot zone having separate, spaced inlets for the solution and air. A reducing diameter nozzle is positioned in the pipe bore between the inlets, for accelerating the air.

The air contacts the solution and turbulently moves down the pipe bore to produce what is known as a "bubbly flow" mixture. The mixture is fed to the nozzle, which is internal of the hot zone. The nozzle has an inlet; a first contraction section of reducing diameter for accelerating the flow, preferably to supersonic velocity, whereby the droplets are reduced in size; a diffuser section of expanding diameter wherein the mixture decelerates and a shock wave may be induced; a second contraction section operative to accelerate the mixture more than the first contraction section; and an orifice outlet for producing a jet or spray. The nozzle assembly is designed to give droplets in the region of 1 to 10 μm.

The use of a two phase nozzle arrangement will be familiar to the skilled man.

Whilst the powder formed after the spray pyrolysis step could be used directly as a ferroelectric material, the product of the spray pyrolysis reaction normally contains non-combusted organic material and traces of anions from the salt that is not decomposed which can be removed by calcination (e.g. at 500 to 1000° C., preferably 550 to 850° C., e.g. about 600° C.). It has been surprisingly found that the final particle size can be controlled by the temperature at which calcination takes place, lower temperatures being associated with smaller particle sizes (See FIG. 5). During the process of the invention, the primary particles or crystallites can aggregate to form agglomerates. Prior to calcination these agglomerates are often of the order of less than 20 microns and hence still represent a free flowing powder. Post calcination the agglomerates have broken down into smaller aggregates of the primary particles, preferably in the range 25 to 500 nm, especially 25 to 200 nm in diameter.

The calcination step also improves the crystallinity of the formed powder. It is a feature of the invention therefore that the alkali metal niobium oxide is a crystalline solid.

Again, the product formed after calcination and optional low energy milling can be used directly as a ferroelectric material. Viewed from another aspect the invention provides an alkali metal niobium oxide obtained by the spray pyrolysis process as hereinbefore defined and after calcination.

It is also possible however for the powder formed after calcination to be milled, typically wet milled to reduce its volume. This is not essential; however, milling ensures a more consistent particle size distribution by breaking down any remaining agglomerates into the primary particles or crystallites. Milling can also be effected in the presence of ethanol. Zirconia is a typical grinding medium.

Powders formed by this process are single phase and are typically submicron in size and non agglomerated.

Doping of the niobates or mixed niobium-tantalum oxides formed by this spray pyrolysis process can be achieved readily be employing a soluble doping metal ion salt or complex in an appropriate amount. The soluble doping metal ion compound can be added into to a precursor solution of Nb ions, any precursor solution of metal A ions or to the mixed solution prior to spray pyrolysis in an appropriate amount depending on the amount of doping meal ion which is desired to be present. It will obviously be necessary to reduce the amount of A solution to reflect the amount of doping metal ion (B) and/or (C) being added.

A convenient way of introducing the doping metal ions into solution is through their nitrates as these are often soluble in water. Thus, for a calcium doping metal ion, a solution of calcium nitrate or calcium nitrate solid can be added to the Nb solution.

A flow scheme of reactions is shown in FIG. 1. It will be appreciated that any metal compound described herein may, in its crystalline form, possess water of crystallisation.

The compounds formed by the process of the invention are preferably ferroelectric, preferably piezoelectric. Ferroelectricity is a spontaneous electric polarization of a material that can be reversed by the application of an external electric field. Piezoelectricity is the ability to generate an electric potential in response to applied mechanical stress.

The materials of the invention are lead free and represent environmentally acceptable alternatives to the materials used today as piezoceramics.

Thus, viewed from another aspect the invention provides a ferroelectric, preferably piezoelectric, compound of formula (I) formed by the process as hereinbefore defined. Viewed from another aspect, the invention provides a ferroelectric, preferably piezoelectric, composition comprising the compound of formula (I) formed by the process as hereinbefore defined. It is preferable that the ferroelectric composition according to the invention will comprise 10-50 wt % of compound (I), more preferably 15-30 wt. %, most preferably 20-25 wt. %.

In a further embodiment, the invention provides a piezoelectric transformer comprising a compound of formula (V):

$$ATaO_3 \qquad (V)$$

(wherein

A is an alkali metal, e.g. Li, Na, K, Rb, Cs and/or Fr;

A may be present as a mixture of two or more alkali metals);

prepared by a process comprising spray pyrolising a solution, for example an aqueous solution, comprising alkali metal (A) ions and Ta ions.

In order to manufacture such ferroelectric compositions sintering of the compounds may be required. Pressing and sintering can be carried out using known conditions. For example, pressing is typically carried out at ambient temperature in any standard press. The sintering temperature is highly dependent on the composition. Normally the sintering has to be done very close to the solidus temperature. Sintering can therefore occur at temperatures up to the solidus temperature of the compound, for example up to 1200° C., e.g. 800 to 1150° C., especially less than 1140° C., more especially less than 1100° C. Sintering can last 0 to 20 hrs, e.g. 3 to 15 hrs.

Prior art compounds have proved difficult to sinter in view of their high particle sizes. The present invention solves that problem and enables sintering at temperatures which are below the temperature at which alkali metals volatise (e.g. around 1000° C.).

As noted above therefore, in order to complete the formation of desirable articles, the particles of the invention are preferably converted into a green body and then sintered. The green body can be formed by any convenient technique such as by pressing or by casting or the like. In one embodiment, the green body is manufactured by tape casting, optionally followed by lamination and pressing. Once formed, the particles of the invention can be formed into a slurry and tape cast on a substrate. A more complete description of this process is given below. The tapes formed can optionally be cut and the pieces laminated together, e.g. at elevated temperatures up to 100° C. and pressed together, e.g. at pressures of 20 to 40 MPa.

However the green body is formed, sintering is preferably effected in an atmosphere enriched with oxygen (relative to air). For example, oxygen content may be at least 30 vol %, especially at least 50 vol %. Pure oxygen may also be used as the sintering atmosphere. The use of an oxygen enriched atmosphere in sintering has been found to improve the properties of the product. Sintering in oxygen gives higher density and a more controlled microstructure. The density of the material sintered in pure oxygen can approach theoretical density, such as at least 92% of theoretical density, preferably at least 94% of theoretical density.

Without wishing to be limited by theory it is believed that the use of an oxygen enriched environment for sintering prevents volatisation of alkali oxides from the compounds of formula (I) thus maintaining very high density.

In a highly preferred embodiment therefore, the sintering process of the invention is carried out in an atmosphere enriched with oxygen, i.e. the oxygen content of the sintering gas is greater than is naturally occurring in air. The oxygen content of the sintering atmosphere is preferably greater than 25 vol %, especially greater than 30 vol % of oxygen, e.g. pure oxygen. It will be appreciated that any other gases present should be inert. Further improvements can be achieved by sintering in pure oxygen compressed to 1-10 bar.

Moreover, the sintering process of the invention can be carried out in the absence of a sintering aid.

This forms a still further aspect of the invention which therefore provides a process comprising sintering a compound of formula (I) as hereinbefore defined in an atmosphere enriched with oxygen, in particular so as to increase density relative to its theoretical density.

Viewed from another aspect the invention provides a compound of formula (I) as hereinbefore defined obtainable by a process in which the compound is sintered in an atmosphere enriched by oxygen, e.g. to have a density relative to its theoretical density of at least 92%.

Hence, the inventors have surprisingly found that it is possible to produce a solid solution of alkali metal niobium oxides with a particle size in the nanometer range. These particles are of interest as potential replacements for PZT as they are easier to sinter. The expected perovskite crystal structure should give rise to a good poling efficiency and thereby good piezoelectric properties.

The present invention also comprises therefore the use of the compounds of the invention for manufacturing electronic and optic devices, including medical diagnostic devices such as ultrasound devices, and/or piezoelectric transformers. Such devices comprising the afore-mentioned ferroelectric composition are also encompassed by the invention. Preferred devices are in particular transducers, ultrasound diagnostic equipment, gas ignitors, accelerometers, displacement transducers, actuators, sensors and piezoelectric transformers.

In another aspect of the invention, said ferroelectric composition can further comprise a polymer. The polymer should have a density lower than the ferroelectric compound. Examples are polyvinylidene fluoride, poly(vinylidene fluoride)hexafluoroproylene or epoxy polymers.

The inventors have devised a further process for preparing still further improved piezoceramics, called dense textured ceramics herein. There are still several challenges associated with the piezoelectrics of this invention such as difficulty in achieving fully densified polycrystalline ceramics and poor phase stability especially in presence of humidity.

In recent years textured ceramics developed by the templated grain growth (TGG) technique have shown excellent anisotropic electrical properties. Highly textured ceramics are fabricated by the preferential growth of large oriented anisometric (with high aspect ratio) particles in a fine-grained matrix. This method requires the use of anisometric particles (templates) and submicron particles (matrix) ideally of the same composition as the target material. The particles of the matrix will grow as oriented grains in the same crystal direction as the templates so that highly grain oriented ceramics can be obtained. The particle size of the matrix should be much smaller than the templates in order to achieve oriented grain growth and proper densification of the ceramics.

Thus viewed from another aspect the invention provides a process comprising:

(I) obtaining sub micron particles of the compound of formula (I) or (Ia) as hereinbefore defined preferably using a spray pyrolysis process as hereinbefore defined;

(II) obtaining needle like particles of the same compound of formula (I) or (Ia) and mixing these with the step (I) particles in a solvent to form a slurry;

(III) tape casting said slurry so as to form a film; and (IV) sintering said film.

A schematic flowchart of the preferred fabrication procedure of the dense textured ceramics of the invention is shown in FIG. 12. This scheme concerns the formation of KNN ceramics ($K_{0.5}Na_{0.5}NbO_3$) but obviously the principles therein apply to all the ceramics of formula (I) or (Ia).

The matrix component is submicron particles of the desired final compound. The sub micron particles can be formed by spray pyrolysis as discussed in detail above. These particles are preferably calcined but not milled. FIG. 15b shows suitable particles. The term sub micron particles is used herein to designate particles having a diameter of less than 10 microns, preferably less than 5 microns. Ideally of course, the particles will have sizes less than 1 micron.

In addition, needle like template crystals are required. Needles are typically prepared by a molten salt synthesis, e.g. at 1000° C. for 6 h in air. For example, the compound $D_2Nb_4O_{11}$ can be prepared by this technique. These compounds are preferably not of the perovskite or tungsten bronze structure. It is preferred therefore in the needle like template crystals are prepared from a compound of formula $D_2Nb_4O_{11}$ where D is as hereinbefore defined.

The needle-like particles can be converted to a compound of formula (I) by chemical conversion in molten DCl for example at 800° C. for 30 Min. A SEM image of the needle like templates prepared by chemical conversion is shown in FIG. 15a).

Suitable needle dimensions are 0.5-1 μm in thickness and 15-20 μm in length. These template particles are therefore preferably at least 10 times longer than there thickness. The templates may have an orthorhombic crystal structure.

The sub micron matrix particles and the template particles can be mixed in any ratio. It is preferred if there is an excess of the submicron particles. Ideally, the sub micron particles form at least 75 wt %, preferably at least 80 wt % of the mixture. The template particles can form up to 25 wt %, such as up to 20 wt % of the mixture. These wt % refer only to the matrix or template content. There should be at least 5 wt % of the template particles. A weight ratio of about 90:10 sub micron to template particles is preferred.

The dense textured ceramics are fabricated by tape casting. This requires the formation of a slurry of the particles. A slurry of the particles can be prepared using an appropriate solvent, typically water. It will be normal also to use a binder in the slurry. Suitable binders include PVA. A plasticizer such as PEG and a defoamer such as PPG can also be employed. It may also be useful to employ a dispersant.

The amounts of these components can vary. What is necessary is that a homogeneous de-aired slurry is formed which is capable of being tape cast. The examples which follow provide guidance on the amounts of these components that can be used.

The tape casting method employed can be conventional although in a highly preferred embodiment, a modified method is employed in which a modified doctor blade is used. This modified blade is adapted to carry a plurality of needles which are capable of orienting the particles in the cast film. These needles are preferably placed in a line perpendicular to the casting direction and dragged across the forming film in the casting direction. This is shown in FIG. 14.

This modified doctor blade orients the particles. The film which forms can be dried. The film is typically between 20 and 100 μm, such as around 50 μm in thickness.

This film can them be calcined and sintered. However, the film that forms is not strong due to its thickness. In order to thicken the film, it is preferred if it is cut and the cut pieces laminated and pressed as is known in the art. Lamination typically takes place at a temperature up to 100° C. with pressing utilising pressures up to 50 MPa, such as 10 to 40 MPa. The resulting laminated film can be 1 to 2.5 mm in thickness, e.g. 2 mm. This film can be calcined, e.g. at temperatures up to 700° C. to form the green body.

Finally, the film can be sintered. As noted above, it is highly preferred to carry out sintering in an oxygen enriched atmosphere. Sintering temperatures are 900° C. to 1500° C., preferably 1000 to 1200° C.

The dense textured ceramics formed by this process can have particularly advantageous properties due to the formation of grains highly oriented in the pseudocubic direction. The orientation factor (F) of the invention is preferably at least 60%, more preferably at least 70%, especially at least 90%.

The alignment of the needle-like templates is crucial both for a strong crystal orientation and for the final density of the ceramic. This is due to the higher green-density achieved by ordering the templates by the modified tape casting process.

Viewed from another aspect therefore the invention provides dense textured ceramics prepared by the processes described above. In particular, the invention provides a compound of formula (I) as hereinbefore defined in the form of an aligned template ceramic, i.e. one formed from a mixture of matrix and template particles, tape cast using the modified doctor blade and sintered, ideally in pure oxygen.

Whilst this aspect of the invention has been primarily described in connection with compounds of formula (I) the same principles can be applied to compounds of formula (Ia). Ideally, in this template matrix embodiment there is no doping on the Nb site and β is 1.

The invention will now be described further with reference to the following non-limiting examples and figures.

EXAMPLE 1

$K_{0.5}Na_{0.5}NbO_3$ Nanopowders Prepared by Spray Pyrolysis

Figure 1:
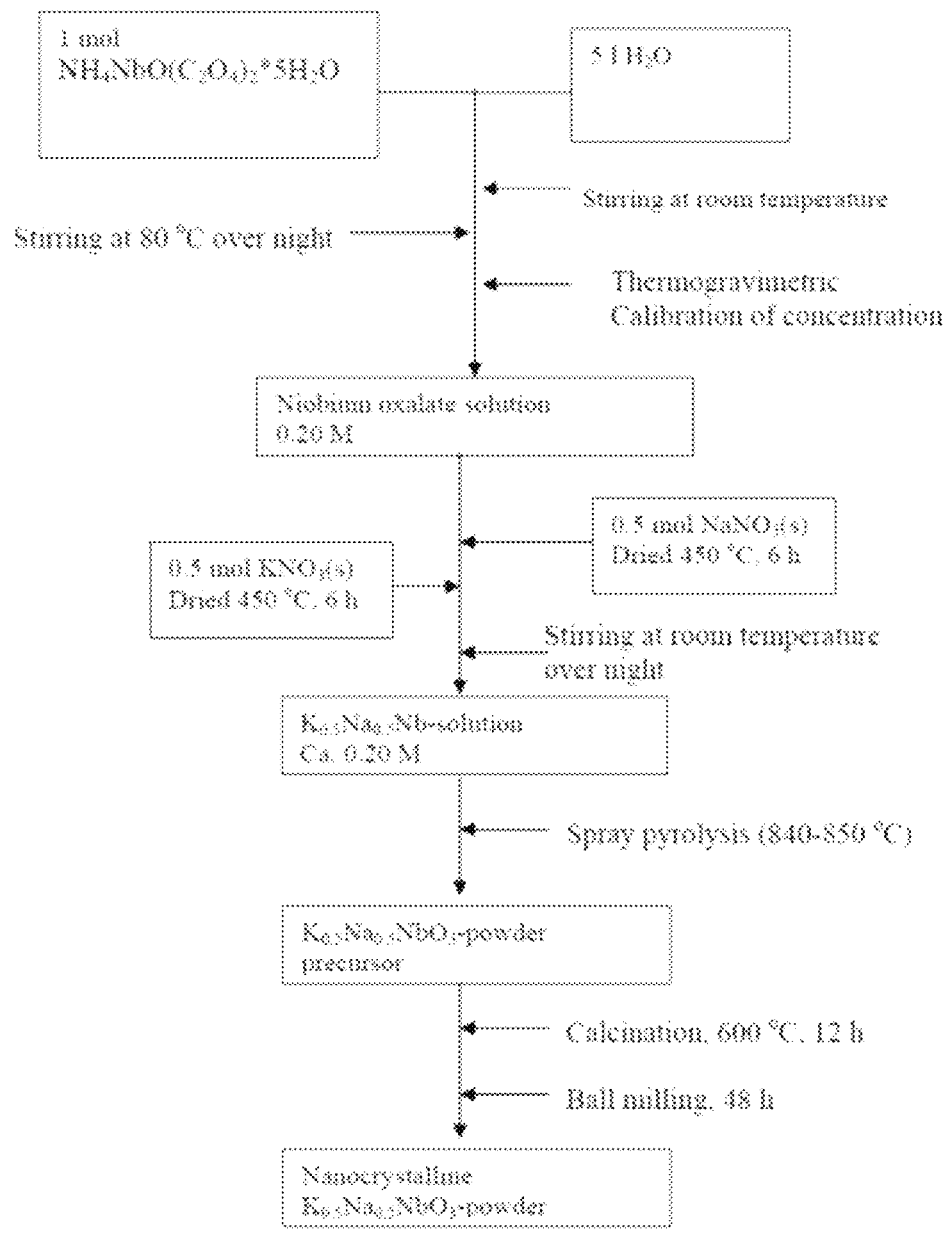
FIG. 1 shows a flow scheme for the formation of $K_{0.5}Na_{0.5}NbO_3$ powder by spray pyrolysis.
Figure 2:
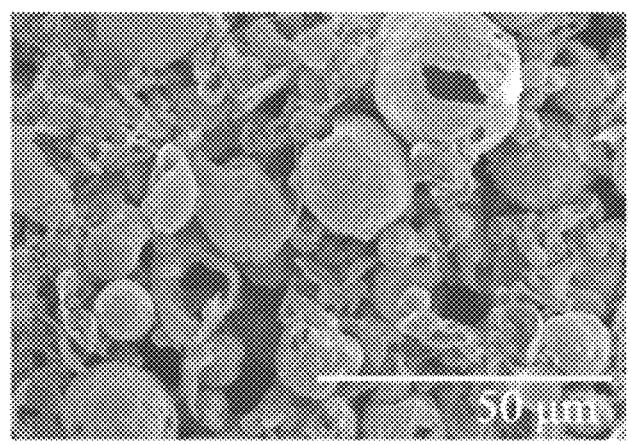
FIG. 2 shows a SEM image of the $K_{0.5}Na_{0.5}NbO_3$ powder precursor produced by spray pyrolysis, prior to calcination and milling.
Figure 3:
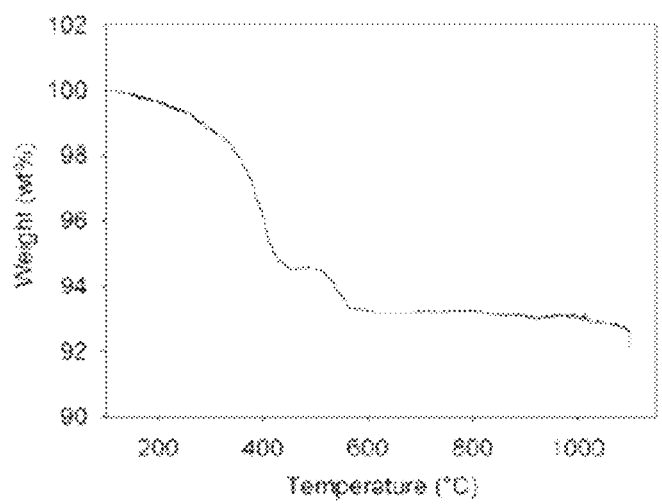
FIG. 3 shows the results of thermogravimetric analysis (TGA) of the spray pyrolysis product, $K_{0.5}Na_{0.5}NbO_3$ powder precursor, in air.

FIG. 1 shows a flowchart for the procedure for preparation of the precursor solutions and the $K_{0.5}Na_{0.5}NbO_3$-powder. The procedure is as follows: 1 mol ammonium niobium dioxalate oxide pentahydrate, $(NH_4)NbO(C_2O_4)_2 \cdot 5H_2O$ (H. C. Starck), was dissolved in 5 liters of water, stirred for 10 minutes at room temperature and then left stirring at 80° C. overnight (12 hours). The concentration of the solution was accurately measured by thermogravimetric analysis. In accordance with the concentration of Nb-solution, appropriate amounts of dried potassium- and sodium-nitrates were added. The solution was left stirring overnight (12 hours) at room temperature and resulted in a homogeneous aqueous $K_{0.5}Na_{0.5}$Nb-solution which was spray pyrolyzed using a home-made pilot scale equipment. A two phase nozzle with 1.5 bar pressurized air was used to atomize the solution at a rate of 8 liters per hour. The diameter of the nozzle was 1 mm. The solution was atomized directly into a rotating furnace keeping a temperature in the range 840 to 850° C. Outlet temperature of the furnace was 450-500° C. The product, called powder precursor, was collected in a cyclone and particle morphology is given in FIG. 2. Thermogravimetric analysis (TGA) of powder precursor is given in FIG. 3 and shows a moderate mass loss basically due to the presence of organic residues, however, above about 550° C. all volatiles have escaped corresponding to a stable mass.

Figure 4:
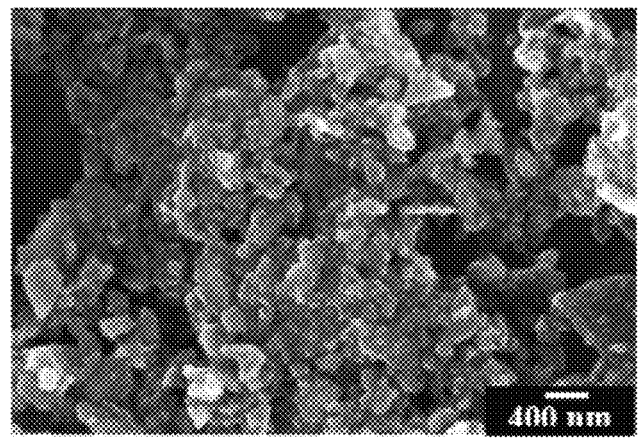
FIG. 4 shows a SEM image of $K_{0.5}Na_{0.5}NbO_3$ powder produced by spray pyrolysis and calcined at 600° C. for 12 hours and ball milled for 48 hours.
Figure 5:
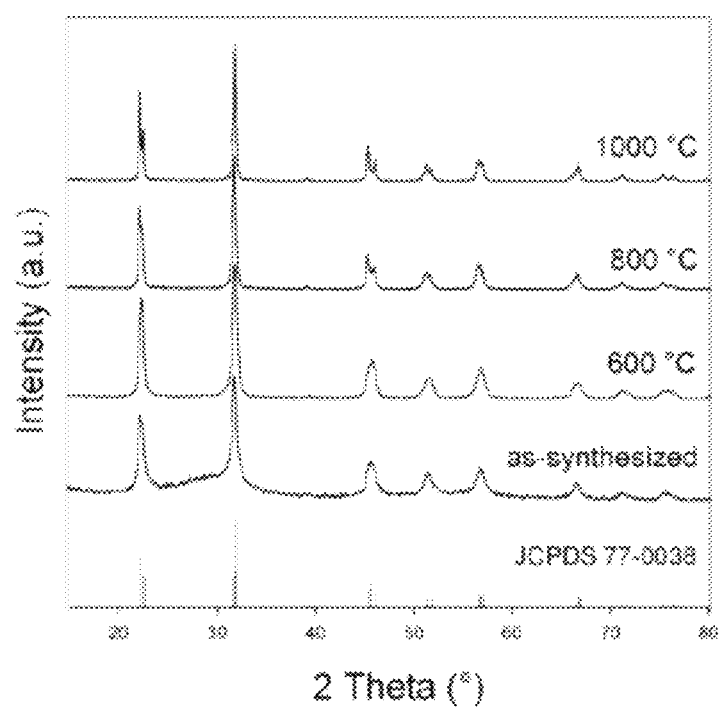
FIG. 5 shows x-ray diffraction patterns of $K_{0.5}Na_{0.5}NbO_3$ powders: a) Powder precursor; b) after calcination at 600° C.; c) 800° C.; and d) 1000° C.
Figure 6:
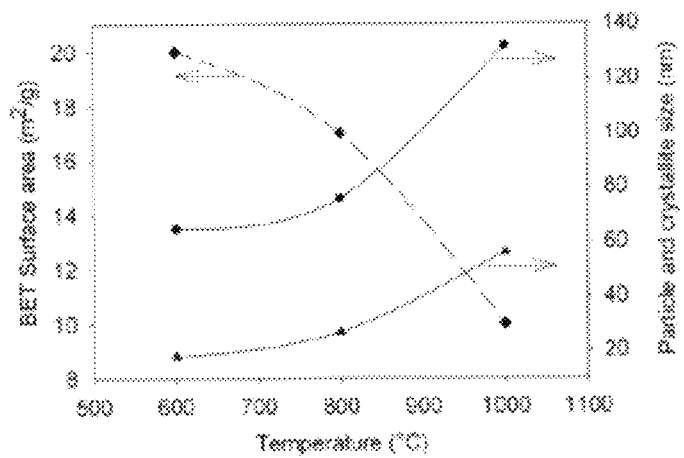
FIG. 6 shows the crystallite and particle size of $K_{0.5}Na_{0.5}NbO_3$ powders as a function of calcination temperature
Figure 7:
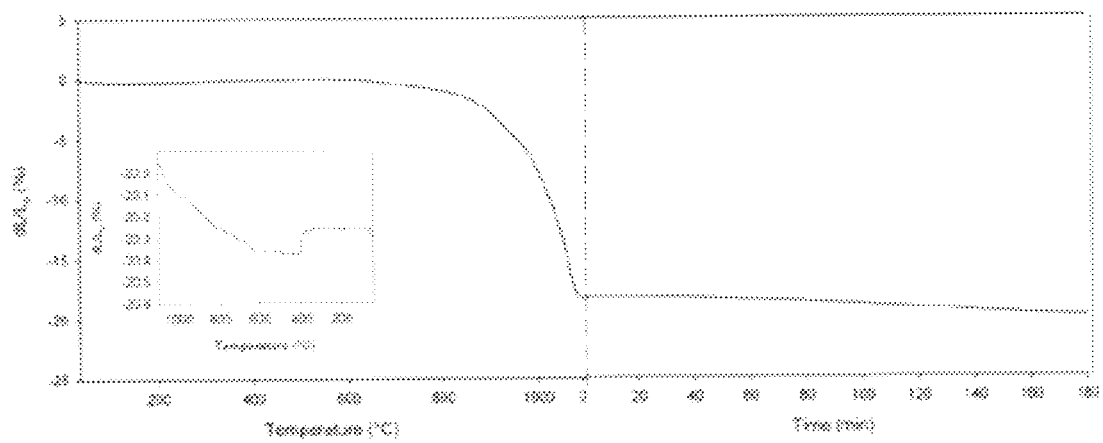
FIG. 7 shows dilatometer measurements of powder compacts of $K_{0.5}Na_{0.5}NbO_3$ powder calcined at 600° C. The curve shows onset of sintering at about 850° C. Inset shows the dimension change during cooling and shows the phase transition temperature of about 400° C.

The resulting very fine powder precursor was calcined at 600° C. for 12 hours to remove residues and increase crystallinity. The powder was dry milled for 5 minutes to reduce the volume. The resulting $K_{0.5}Na_{0.5}NbO_3$ powder was further ball milled for 48 hours in ethanol with zirconia as grinding media. The resulting powder was a submicron non-agglomerated powder of single phase and FIG. 4 shows a SEM image. The phase purity of the powders are documented in the x-ray diffractograms given in FIG. 5, and it is seen that even powder precursor (as collected from the cyclone) exhibit a high phase purity, however with broad peaks due to nanosized crystallites. The particle size of the powder precursor is a parameter which may be controlled by heat treatment (calcination). In FIG. 6 crystallite and particle size are reported for powders calcined at 600, 800 and 1000° C., respectively. The crystallite size measured from x-ray diffractograms is in the range from about 20 to 60 nm. The particle sizes which are average numbers based on surface area measurements by $N_2$ adsorption is increasing from about 65 nm after calcination at 600° C. to about 130 nm after calcination at 1000° C. The prepared $K_{0.5}Na_{0.5}NbO_3$ fine powder calcined at 600° C. shows excellent sintering properties as can be seen from the onset of sintering at approximately 850° C. in FIG. 7 which shows the dilatometer results.

EXAMPLE 2

$KNbO_3$ Nanopowders Prepared by Spray Pyrolysis

Figure 8:
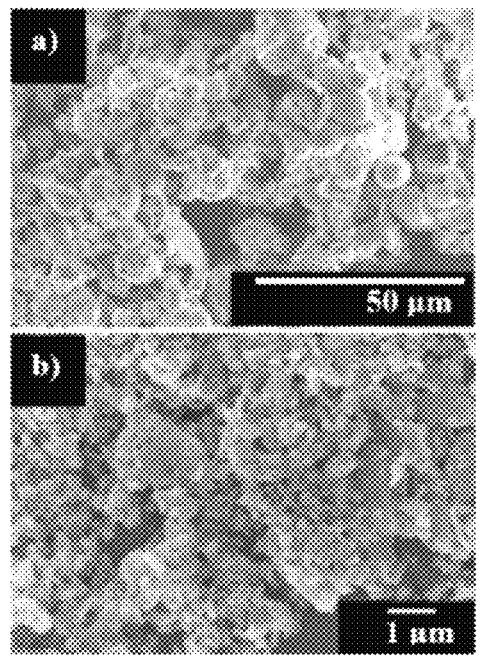
FIG. 8 shows SEM images of $KNbO_3$: a) powder precursor; and b) powder calcined at 800° C. and milled for 48 hours.
Figure 9:
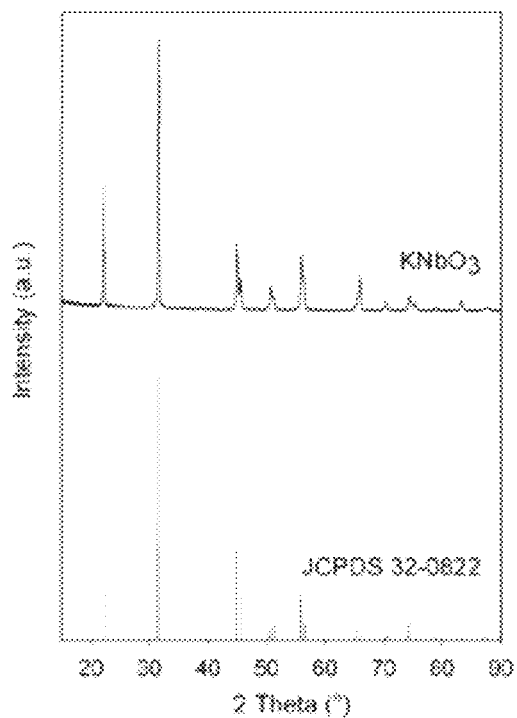
FIG. 9 shows the projected theoretical x-ray diffraction pattern of $KNbO_3$ and the x-ray diffraction pattern of $KNbO_3$ powder prepared by spray pyrolysis and calcined at 800° C.

The aqueous precursor solution was prepared in a similar manner as for Example 1, except that 1 mol of potassium nitrate was added instead of half a mole of sodium and potassium nitrate. The precursor solution was spray pyrolyzed as described under Example 1 and the resulting powder precursor was treated in a similar manner. The morphology of the $KNbO_3$ precursor powder and powder calcined at 800° C. followed by ball milling for 48 hours is shown in FIG. 8. The powder after calcination and milling consists of submicron particles. The x-ray diffractogram in FIG. 9 shows that the powder is single phase. Onset of densification is recorded to be at 1000° C.

EXAMPLE 3

$NaNbO_3$ Nanopowders Prepared by Spray Pyrolysis

Figure 10:
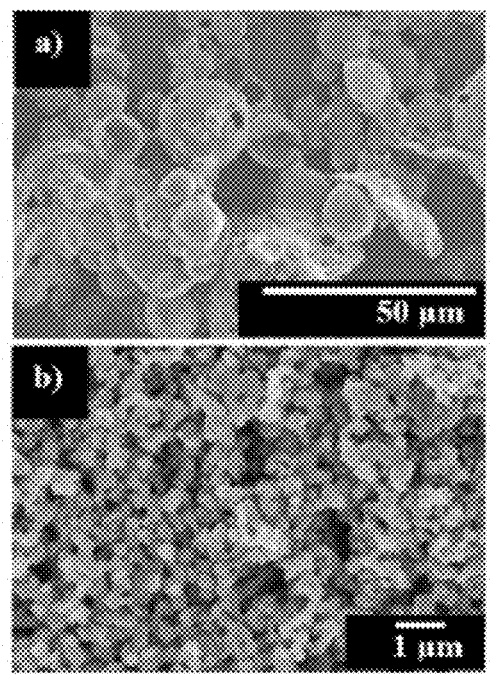
FIG. 10 shows SEM images of $NaNbO_3$: a) powder precursor; and b) powder calcined at 800° C. and milled for 48 hours.
Figure 11:
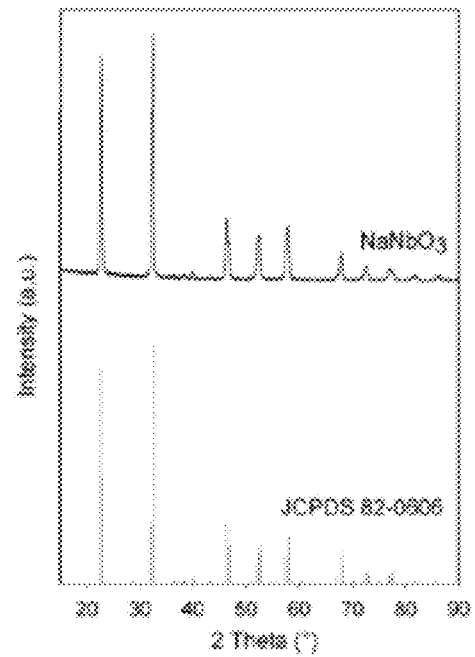
FIG. 11 shows the projected theoretical x-ray diffraction pattern of $NaNbO_3$ and the x-ray diffraction pattern of $NaNbO_3$ powder calcined at 800° C.
Figure 12:
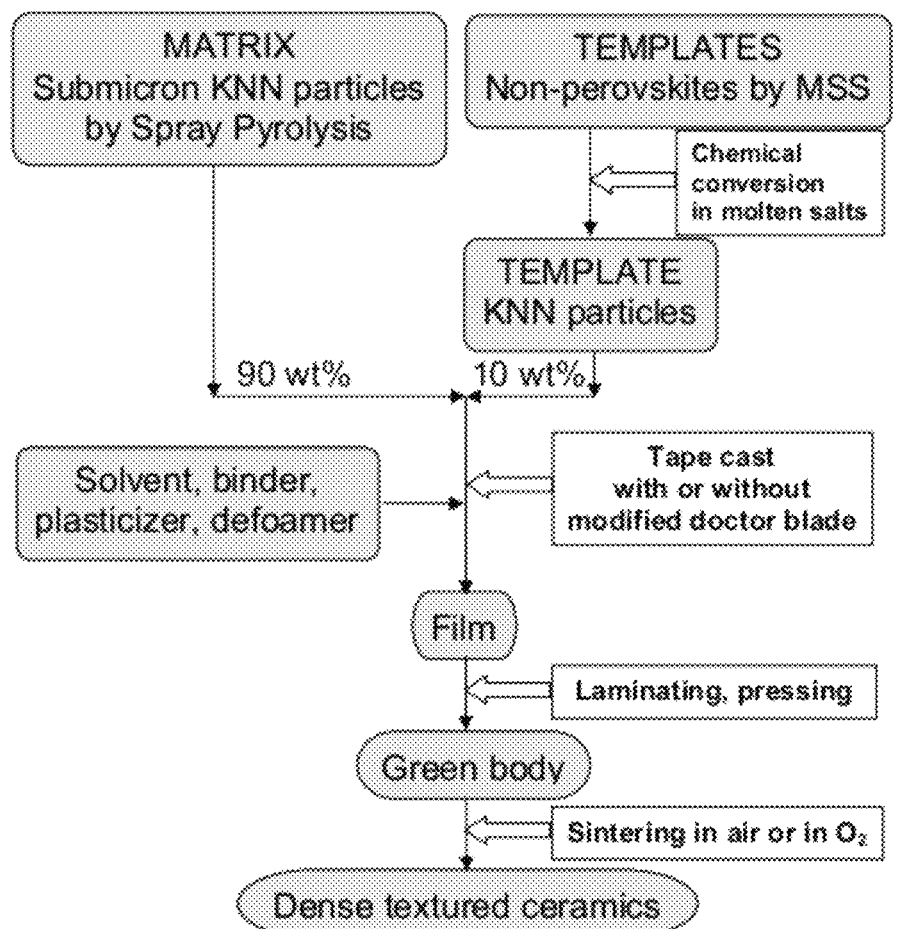
FIG. 12 is a flow chart for dense textured ceramic formation.

The aqueous precursor solution was prepared in a similar manner as for Example 2, except that 1 mole of sodium nitrate was added instead of one mole of potassium nitrate. The precursor solution was spray pyrolyzed as described under Example 1 and the resulting powder precursor was treated in a similar manner. The morphology of the $NaNbO_3$ precursor powder and powder calcined at 800° C. followed by ball milling for 48 hours is shown in FIG. 10. The powder after calcination and milling consists of submicron particles. The x-ray diffractogram in FIG. 11 shows that the powder is single phase. Onset of densification is recorded to be at 1200° C.

EXAMPLE 4

The Fabrication of the Anisometric KNN ($K_{0.5}Na_{0.5}NbO_3$)

Figure 15:
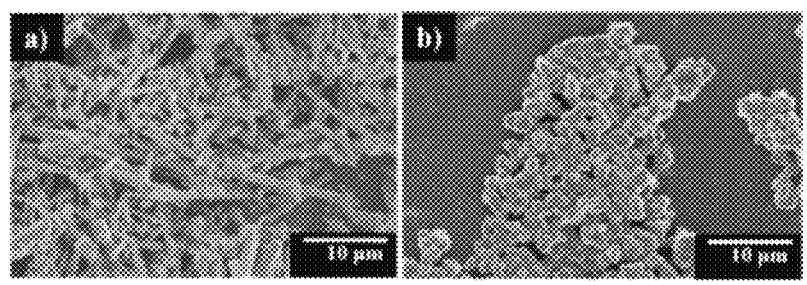
FIG. 15 Precursors (a) KNN needle-like particles by topotactic conversion in molten salts at 830° C., (b) KNN sub micron particles by spray pyrolysis and calcined at 600° C.

The fabrication of the anisometric KNN templates was performed using two separate steps. The non-perovskite $K_2Nb_4O_{11}$ compound with high aspect ratio was first prepared by molten salt synthesis at 1000° C. for 6 h in air. The needle-like particles were converted to KNN by chemical conversion in molten KCl at 800° C. for 30 min. A SEM image of the KNN templates prepared by chemical conversion is shown in FIG. 15a. The templates had a needle-like shape with dimensions 0.5-1 μm in thickness and 15-20 μm in length. The templates had an orthorhombic crystal structure with lattice parameters a=3,961 Å, b=5,670 Å, c=5,698 Å and the high aspect ratio along the [001] direction.

EXAMPLE 5

Slurry Formation

Textured ceramics were fabricated by the tape casting. A slurry comprising KNN powder from example 1 (which forms the matrix component), distilled water and Darvan was mixed and the resulting slurry was dispersion milled (ball mill, YTZ balls) for 5-6 hours at about 60 rpm. The binder used was a 15 wt % PVA-distilled water solution. The plasticizer and the defoamer were then added to the suspension and left for further milling for another 16-24 h. Table 1 provides the slurry composition details

TABLE 1

| Function | Slurry A | Slurry B | Weight ratio (%) | Company |
|---|---|---|---|---|
| Powder | KNN (90 wt % matrix, 10 wt % template) | KNN (100 wt % matrix) | 29.65 | — |
| Solvent | Distilled Water | Distilled Water | 35.5 | — |
| Dispersant | Ammonium Polymethacrylate, Darvan© | Ammonium Polymethacrylate, Darvan© | 0.12 | R.T. Vanderbilt Company, Inc., USA |
| Binder | Polyvinyl Alcohol, PVA | Polyvinyl Alcohol, PVA | Solution of 15 wt % PVA and distilled water 33.6 | Merck, Germany |
| Plasticizer | Polyethylene glycol, PEG | Polyethylene glycol, PEG | 0.85 | Fluka, Germany |
| Defoamer | Polypropylene glycol, PPG | Polypropylene glycol, PPG | 0.28 | Acros Organics, USA |

EXAMPLE 6

Matrix Tape Casting and Sintering

The slurry of example 5b was de-aired by using ultrasound bath for 30 min, evacuation for 10 min and finally aged for 30 min without stirring. The slurry was then casted on a Mylar© film using a Table Top Caster TTC-1200 (Mistler©, Richard E. Mistler, Inc.) tape cast equipment, using a speed carrier of about 20 cm/min. A Mistler doctor blade was used.

The tape was dried in air at room temperature for 12 h, obtaining a sheet of about 50 μm in thickness. The tape was cut into 2×2 cm squares which were laminated and hot pressed at 70° C. with a pressure of 30 MPa for 10 min to make 2 mm thick compacts. The binder burnout was performed in air or in pure oxygen at 600° C. for 2 hours using a heating rate of 0.1° C./min. The samples were sintered with heating rate of 200° C./h up to temperatures in the range 1050-1100° C. for 3 and 14 h in pure oxygen.

EXAMPLE 7

Template/Matrix Casting and Sintering

The slurry of example 5a was de-aired by using ultrasound bath for 30 min, evacuation for 10 min and finally aged for 30 min without stirring. The slurry was then casted on a Mylar© film using a Table Top Caster TTC-1200 (Mistler©, Richard E. Mistler, Inc.) tape cast equipment, using a speed carrier of about 20 cm/min.

Two kinds of doctor blades were used: the normal version made by Mistler© (to give randomly oriented templates) and a modified version (to give aligned templates). The modified version consisted of an additional gate made of needles separated by a distance of 0.5 mm in order to divide the flux in many small fluxes and so to increase the shear forces between the particles that could orient them along the casting direction.

The tape was dried in air at room temperature for 12 h, obtaining a sheet of about 50 μm in thickness to form the dry green tape. The tape was cut into 2×2 cm squares which were laminated and hot pressed at 70° C. with a pressure of 30 MPa for 10 min to make 2 mm thick compacts. The binder burnout was performed in air or in pure oxygen at 600° C. for 2 hours using a heating rate of 0.1° C./min. The samples were sintered with heating rate of 200° C./h up to temperatures in the range 1050-1100° C. for 3 and 14 h in pure oxygen.

The results are summarised in Table 2

TABLE 2

| | No Templates | Aligned Templates | Randomly Oriented templates |
|---|---|---|---|
| 3 h, 1050° C., $O_2$ | — | First grain growth of the particles onto the templates | First grain growth of the particles onto the templates |
| 3 h, 1100° C., $O_2$ | — | Elongated grains aligned in the casting direction | Many elongated grains but randomly oriented |
| 14 h, 1100° C., $O_2$ | 84% dense F = 0% | 95% dense F = 75% | 80% dense F = 30% |

F is orientation factor - Lotgering factor measured by X-ray diffraction.

Figure 13:
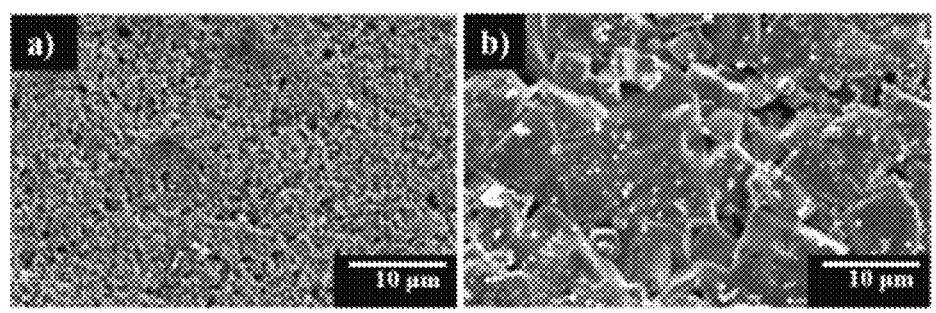
FIG. 13 shows the improvement in grain growth achieved in a laminated and pressed tape, sintered in pure oxygen vs a green tape. SEM images of the KNN materials prepared from submicron powder, (a) green tape, (b) 20 tapes laminated at 70° C. and 30 MPa and then sintered at 1100° C. for 14 h in pure oxygen are shown.
Figure 14:
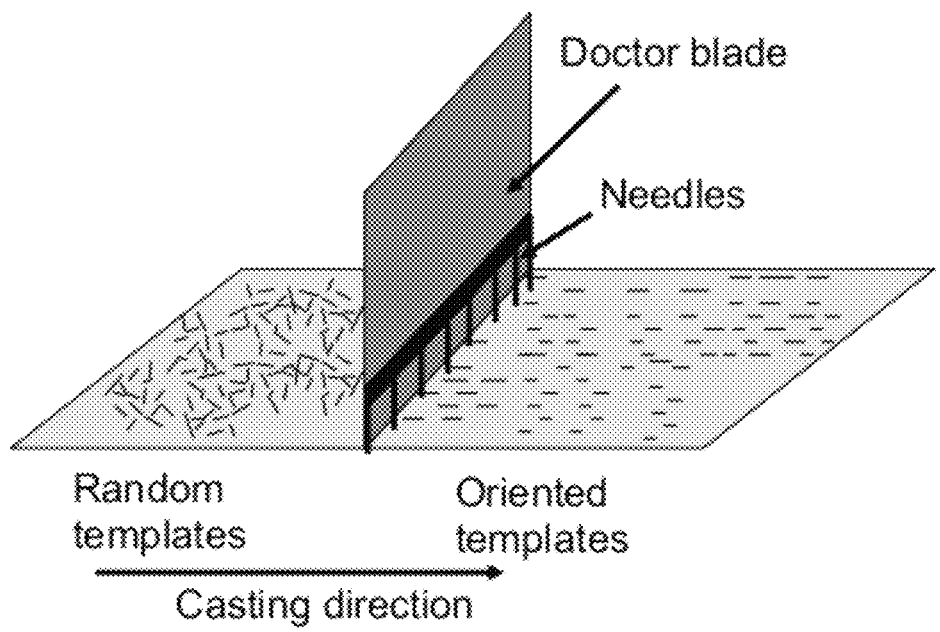
FIG. 14 shows the modified doctor blade of the invention

FIG. 13b shows KNN materials formed with no template particles sintered at 1100° C. for 14 h in oxygen. FIG. 13a contrasts that with an unsintered material.

Figure 17:
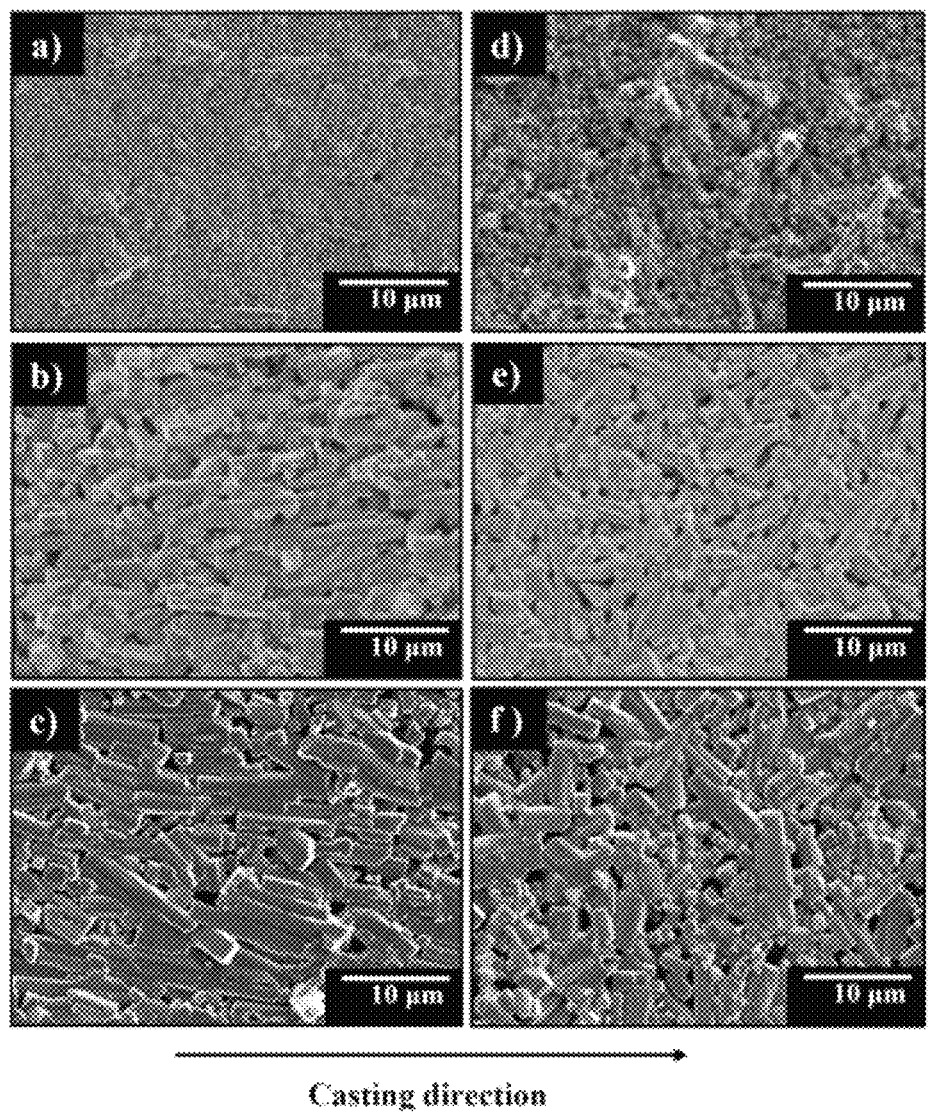
FIG. 17 shows SEM images of KNN tapes (front view) with 10 wt % templates. (a) and (d) green tapes, (b) and (e) tape sintered at 1100° C. for 3 h, (c) and (f) tape laminates sintered at 1100° C. 14 h. Samples in (a), (b) and (c) are made by alignment of the templates by using the modified doctor blade method. Samples in (d), (e) and (f) are made by the normal doctor blade method.

SEM images of the KNN ceramics fabricated by tape casting and hot lamination are shown in FIG. 17. FIGS. 17a), b) and c) correspond to the samples fabricated by tape casting using the modified doctor blade method, and alignment of the templates parallel to the tape cast direction is evident. FIGS. 17d), e) and f) correspond to samples fabricated with the normal doctor blade method. In this case the templates are aligned parallel to the tape casting plane, but they are randomly oriented within the tape casting plane. FIGS. 17a) and d) correspond to the green samples, showing the templates surrounded by the submicron particles. FIGS. 17b) and e) correspond to ceramic compacts sintered at 1100° C. for 3 h, demonstrating the grain growth both of the templates and of the submicron particles. In particular in the case of the material with aligned templates, it is evident that the growth of the matrix grains is in the same direction of the templates. The materials sintered at 1100° C. for 14 hours correspond to the FIGS. 7c) and f). The material fabricated by the modified tape casting, FIG. 7c), shows an ordered microstructure with grains with needle-like shape and elongated in the direction of the tape casting with length in the range 10-15 μm.

EXAMPLE 8

Sintering Atmosphere

Figure 16:
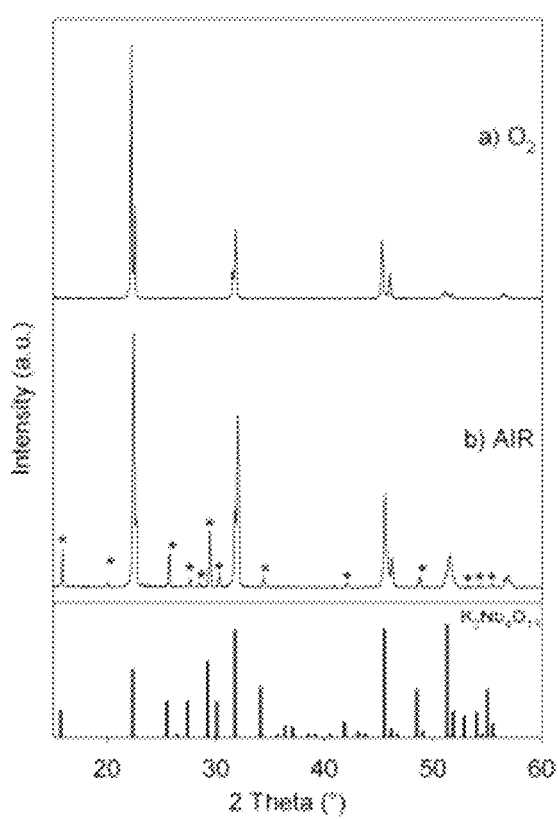
FIG. 16 shows XRD patterns of KNN tape laminated and sintered at 1100° C. for 14 h in air or in oxygen atmosphere. Diffraction lines belonging to an extra phase $(Na,K)_2Nb_4O_{11}$ are indicated by *.

The benefits of the pure oxygen sintering atmosphere have been investigated by sintering no template KNN at 1100° C. for 14 h in air or in pure oxygen. FIG. 16 shows the X-ray diffractograms of samples sintered in air and in pure oxygen. Sintering in oxygen gave phase pure material (FIG. 16a)), while for sample sintered in air a secondary phase (indicated by * in FIG. 16b)) was detected. The secondary phase can be indexed to the tetragonal tungsten-bronze (TTB) structure of $K_2Nb_4O_{11}$.

The invention claimed is:

1. A process for the preparation of an alkali metal niobium oxide of formula (Ia):

$$A_{1-2x-3w}B_xC_wNb_{1-y-3/5z-u}Ta_yFe_zSb_uO_3 \quad (Ia)$$

wherein
A is Li, Na, K, Rb, Cs, Fr, or a mixture thereof;
B is Ba, Ca, Mg, Sr, or a mixture thereof,
C is La, and/or Bi;
$0 \leq u \leq 0.3$; $0 \leq w \leq 0.3$; $0 \leq x \leq 0.3$, $0 \leq y < 1$ and $0 \leq z \leq 0.3$, the values of u, w, x, y and z being independent of each other with the proviso that the sum of $y+3/5z+u$ is less than 1 and with the proviso that the sum of $3w+2x$ is less than 1;
comprising spray pyrolising an aqueous solution, comprising alkali metal (A) ions, Nb ions and optionally alkaline earth ions (B), Ta Sb, La, Bi, and/or Fe ions, to form a powder and calcining said powder.

2. A process as claimed in claim 1 for the preparation of an alkali metal niobium oxide of formula (Ib):

$$A_{1-2x-3w}B_xC_wNb_{1-y-3/5z}Ta_yFe_zO_3 \quad (Ib)$$

wherein
A is Li, Na, K, Rb, Cs, Fr, or a mixture thereof;
B is Ba, Ca, Mg, Sr, or a mixture thereof,
C is La, and/or Bi;
$0 \leq w \leq 0.3$; $0 \leq x \leq 0.3$, $0 \leq y < 1$ and $0 \leq z \leq 0.3$, the values of w, x, y and z being independent of each other with the proviso that the sum of $y+3/5z$ is less than 1 and with the proviso that the sum of $3w+2x$ is less than 1;
comprising spray pyrolising a solution, for example an aqueous solution, comprising alkali metal (A) ions, Nb ions and optionally alkaline earth ions (B), Ta, La, Bi, and/or Fe ions to form a powder and calcining said powder.

3. A process as claimed in claim 2 for the preparation of an alkali metal niobium oxide of formula (Ic):

$$A_{1-2x}B_xNb_{1-y}Ta_yO_3 \quad (IC)$$

wherein
A is Li, Na, K, Rb, Cs, Fr, or a mixture thereof;
B is Ba, Ca, Mg, Sr, or a mixture thereof;
$0 \leq x \leq 0.3$ and $0 \leq y < 1$, the values of x and y being independent of each other;

comprising spray pyrolising an aqueous solution, comprising alkali metal (A) ions, Nb ions and optionally alkaline earth ions (B) and/or Ta ions, so as to form a powder and calcining said powder.

4. A process according to claim 1 wherein x=0.
5. A process according to claim 1 wherein w=0.
6. A process according to claim 1 wherein z=0.
7. A process according to claim 1 wherein y=0.
8. A process according to claim 1 wherein A is Na or K or a mixture thereof.
9. A process according to claim 1 wherein y=0-0.5.
10. A process according to claim 1 wherein spray pyrolysis is performed by atomisation of the solution into a furnace at a temperature of at least 800° C.
11. A process according to claim 1 wherein the aqueous solution is prepared from water soluble precursors comprising at least one alkali metal nitrate or oxalate.
12. A process according to claim 11 wherein said precursors are selected from the group consisting of sodium nitrate, potassium nitrate, ammonium niobium dioxalate ((NH4)NbO(C2O4)2) and tantalum oxalate.
13. A process according to claim 1 in which said niobium compound forms a free flowing powder directly after spray pyrolysis.
14. A process according to claim in 13 which said niobium compound formed directly after spray pyrolysis does not adhere to any surface.
15. A process according to claim 1 in which spray pyrolysis is carried out using a two phase nozzle arrangement.

16. A process according to claim 1 in which the particles obtained directly after spray pyrolysis are perovskite or tungsten bronze in structure.
17. A process according to claim 1 further comprising collecting the spray pyrolysis fine powder product by cyclone and calcining at a temperature in the range of 500-1000° C.
18. A process as claimed in claim 17 wherein said calcination is carried out at a temperature of 550 to 850° C.
19. A process according claim 1 further comprising forming calcined, spray pyrolysed particles into a green body and sintering said green body.
20. A process as claimed in claim 1 further comprising milling of the powder after calcination.
21. A process as claimed in claim 1 wherein Nb ions are provided via a Nb oxalate or dioxalate.
22. A process as claimed in claim 1 wherein Nb ions are provided via $NH_4NbO(C_2O_4)_2$.
23. A process as claimed in claim 1 for the preparation of a compound of formula (IV)

$$Na_{1-x}K_xNbO_3 \hspace{3cm} (IV)$$

where x is between 0 and 1.

24. A process as claimed in claim 1 for the preparation of a compound of formula (IV)

$$Na_{1-x}K_xNbO_3 \hspace{3cm} (IV)$$

where x is between 0.4 and 0.6.

* * * * *